US010978231B2

(12) United States Patent
Easter et al.

(10) Patent No.: US 10,978,231 B2
(45) Date of Patent: Apr. 13, 2021

(54) METHOD AND SYSTEM FOR DEACTIVATING AN ACOUSTO-MAGNETIC LABEL

(71) Applicant: SENSORMATIC ELECTRONICS, LLC, Boca Raton, FL (US)

(72) Inventors: Ronald B. Easter, Parkland, FL (US); Guillermo H. Padula, Boca Raton, FL (US); Thomas Patrick Solaski, Boca Raton, FL (US); Mohammad Mohiuddin, Boynton Beach, FL (US)

(73) Assignee: Sensormatic Electronics, LLC, Boca Raton, FL (US)

( * ) Notice: Subject to any disclaimer, the term of this patent is extended or adjusted under 35 U.S.C. 154(b) by 0 days.

(21) Appl. No.: 16/438,118

(22) Filed: Jun. 11, 2019

(65) Prior Publication Data

US 2020/0395154 A1    Dec. 17, 2020

(51) Int. Cl.
*H01F 7/06* (2006.01)
*G06K 19/06* (2006.01)
*H03H 9/24* (2006.01)

(52) U.S. Cl.
CPC ....... *H01F 7/064* (2013.01); *G06K 19/06206* (2013.01); *H03H 9/24* (2013.01); *G06K 2019/06253* (2013.01)

(58) Field of Classification Search
CPC .......................... H01F 7/064; G06K 19/06206
USPC ............................... 235/493, 492; 340/572.1
See application file for complete search history.

(56) References Cited

U.S. PATENT DOCUMENTS

| 5,884,425 A * | 3/1999 | Baldwin | G09F 3/0292 283/101 |
| 2005/0265407 A1* | 12/2005 | Braun | H01S 5/4006 372/30 |
| 2006/0273901 A1* | 12/2006 | Hall | G08B 13/2411 340/572.1 |
| 2010/0137938 A1* | 6/2010 | Kishawi | A61N 1/36071 607/46 |
| 2012/0303002 A1* | 11/2012 | Chowaniec | A61B 17/07207 606/1 |
| 2016/0351035 A1* | 12/2016 | Wong | G06K 19/0672 |
| 2017/0140030 A1* | 5/2017 | Schmidtler | G06F 16/22 |
| 2019/0278949 A1* | 9/2019 | Wu | H04W 12/12 |
| 2019/0287361 A1* | 9/2019 | Patterson | G08B 13/246 |
| 2019/0304277 A1* | 10/2019 | Bergman | G08B 13/2425 |
| 2020/0043308 A1* | 2/2020 | Zhang | G08B 13/2434 |

* cited by examiner

*Primary Examiner* — Allyson N Trail
(74) *Attorney, Agent, or Firm* — Arent Fox LLP

(57) ABSTRACT

Aspects of the present disclosure include methods, apparatus, and systems for deactivating an AM tag including receiving a deactivation signal via a first inductive coil, storing electrical charges generated from the deactivation signal in a capacitor, and discharging the electrical charges through a second inductive coil, wherein: a first bias strip in the demagnetized state and a second bias strip cause a resonator to vibrate at a first resonant frequency corresponding to an activated state of the AM tag, the discharging magnetizes the first bias strip from a demagnetized state to a magnetized state, and the first bias strip in the magnetized state and the second bias strip cause the resonator to vibrate at a second resonant frequency different than the first resonant frequency, wherein the resonator vibrating at the second resonant frequency corresponds to a deactivated state of the AM tag.

20 Claims, 5 Drawing Sheets

METHOD AND SYSTEM FOR DEACTIVATING AN ACOUSTO-MAGNETIC LABEL

BACKGROUND

Merchandise items offered by a vendor may be sold in one or more "brick-and-mortar" stores of the vendor. The customer may enter the one or more brick-and-mortar stores of the vendor and purchase the merchandise items. Unfortunately, the vendor and/or the customer may encounter loss due to theft.

To reduce theft, many vendors utilize loss-prevention measures to minimize the number of stolen merchandise. Some loss-prevention measures include security monitoring, inventory tracking, and electronic article surveillance. In particular, electronic article surveillance may include using an acousto-magnetic (AM) tag attached to the merchandise. However, the AM tags may be inconvenient to use because, after the purchase of the merchandise items by the customer, the AM tags may only be disabled by the employees of the one or more brick-and-mortar stores using bulky equipment (e.g., heavy disabling devices having very strong magnetic fields). Specifically, the AM tags may be disabled by demagnetizing one or more bias strips using a magnetic field (e.g., energy above 10 Joules, 12 Joules, 14 Joules, 16 Joules or 20 Joules). Additionally, the disabling devices may pose a health risk to store personnel, as high-dosage exposures to the amount of electro-magnetic energy used to disable the AM tags may approach regulatory maximum limits. Also, current methods of disabling AM tags may not be convenient to consumer, for example, if the employees forget to disable the tags in the store during a purchase transaction, the customer may be required to bring the merchandise items (with AM tags still attached) back to the store for disabling. Therefore, improvement in electronic article surveillance tags are desirable.

SUMMARY

This summary is provided to introduce a selection of concepts in a simplified form that are further described below in the DETAILED DESCRIPTION. This summary is not intended to identify key features of the claimed subject matter, nor is it intended to be used as an aid in determining the scope of the claimed subject matter.

An aspect of the present disclosure includes a method for deactivating an AM tag including receiving a deactivation signal via a first inductive coil, storing electrical charges generated from the deactivation signal in a capacitor, and discharging the electrical charges through a second inductive coil, wherein: a first bias strip in the demagnetized state and a second bias strip cause a resonator to vibrate at a first resonant frequency corresponding to an activated state of the AM tag, the discharging magnetizes the first bias strip from a demagnetized state to a magnetized state, and the first bias strip in the magnetized state and the second bias strip cause the resonator to vibrate at a second resonant frequency different than the first resonant frequency, wherein the resonator vibrating at the second resonant frequency corresponds to a deactivated state of the AM tag.

Some aspects of the present disclosure includes an AM tag having a resonator, a first bias strip, a second bias strip, a biasing coil at least partially encapsulating the first bias strip, and a circuit including: a receiving coil configured to receive a deactivation signal, a capacitor configured to store electrical charges generated from the deactivation signal, a controller configured to cause the electrical charges to discharge from the capacitor through the biasing coil, wherein: the first bias strip in the demagnetized state and a second bias strip cause a resonator to vibrate at a first resonant frequency corresponding to an activated state of the AM tag, the discharging magnetizes the first bias strip from a demagnetized state to a magnetized state, and the first bias strip in the magnetized state and the second bias strip cause the resonator to vibrate at a second resonant frequency different than the first resonant frequency, wherein the resonator vibrating at the second resonant frequency corresponds to a deactivated state of the AM tag.

Certain aspects of the present disclosure includes a system having an AM tag, comprising: a first bias strip, a second bias strip, a biasing coil at least partially encapsulating the first bias strip, and a circuit including: a receiving coil configured to receive a deactivation signal, a capacitor configured to store electrical charges generated from the deactivation signal, a controller configured to cause the electrical charges to discharge from the capacitor through the biasing coil, wherein: the first bias strip in the demagnetized state and a second bias strip cause a resonator to vibrate at a first resonant frequency corresponding to an activated state of the AM tag, the discharging magnetizes the first bias strip from a demagnetized state to a magnetized state, and the first bias strip in the magnetized state and the second bias strip cause the resonator to vibrate at a second resonant frequency different than the first resonant frequency, wherein the resonator vibrating at the second resonant frequency corresponds to a deactivated state of the AM tag, and a detector comprising: a transmitter configured to transmit an interrogating signal to the AM tag, and a receiver configured to: detect an induced signal in response to the resonator vibrating at the first resonant frequency, and fail to detect the induced signal in response to the resonator vibrating at the second resonant frequency.

BRIEF DESCRIPTION OF THE DRAWINGS

The features believed to be characteristic of aspects of the disclosure are set forth in the appended claims. In the description that follows, like parts are marked throughout the specification and drawings with the same numerals, respectively. The drawing figures are not necessarily drawn to scale and certain figures may be shown in exaggerated or generalized form in the interest of clarity and conciseness. The disclosure itself, however, as well as a preferred mode of use, further objects and advantages thereof, will be best understood by reference to the following detailed description of illustrative aspects of the disclosure when read in conjunction with the accompanying drawings, wherein:

DETAILED DESCRIPTION

In many retail stores, acousto-magnetic (AM) tags (also referred to as AM labels) may be deployed to deter theft. For example, "activated" AM tags (i.e., AM tags with magnetized bias strips) may be attached to merchandise items. When a would-be shoplifter attempts to remove the merchandise items with the activated AM tags from the store, a detection system (e.g., placed at an entrance of the store) may detect the activated tags and sound an alarm to alert employees of a store that the merchandise items are about to be taken from the store with activated AM tags. The detection system may detect the activated tags because an acousto-magnetic signal of a specific frequency transmitted by the detection system may cause magnetized bias strips in the AM tag to generate a response signal at a resonant frequency that is the same frequency as the acousto-magnetic signal. As such, the response signal can be detected by the detection system, which may trigger an alarm. When a customer buys the merchandise items, however, an employee may deactivate the AM tags (i.e., shift the resonant frequency of the resonator so the resonant frequency of the resonator is different than the frequency of the detection system) after the purchase. The detection system may be unable to detect the deactivated AM tags. However, current disabling devices to deactivate the AM tags have one or more disadvantages, as discussed above.

In an aspect of the present disclosure, an AM tag may further include an inductor-capacitor tuned circuit that may be used to generate DC pulses to deactivate the AM tag. The circuit may include an air-core inductor designed such that a bias strip may be placed inside the windings or coil of the inductor. An energy harvesting circuit may be connected to the capacitor via a switch. The harvesting circuit may include a voltage-multiplying rectifier to generate a sufficient voltage across the capacitor, which may be received via an antenna tuned for receiving a deactivating signal.

More specifically, the inductor coil may encapsulate a demagnetized bias strip that is placed adjacent to the AM tag. When the deactivation of the AM tag is desired, the deactivation signal in the form of radio frequency (RF) energy may be transmitted to the circuit described above and received by the tuned antenna. The energy may be harvested and stored in the capacitor. When the voltage across the capacitor reaches a predetermined threshold value, the energy may be released into the inductor to generate the DC pulses which act as one or more deactivation pulses that magnetize the bias strip, and hence, deactivate the AM tag. In some examples, mechanisms (e.g., mechanical or electrical) may be implemented in the circuit to prevent accidental deactivation.

Figure 1:
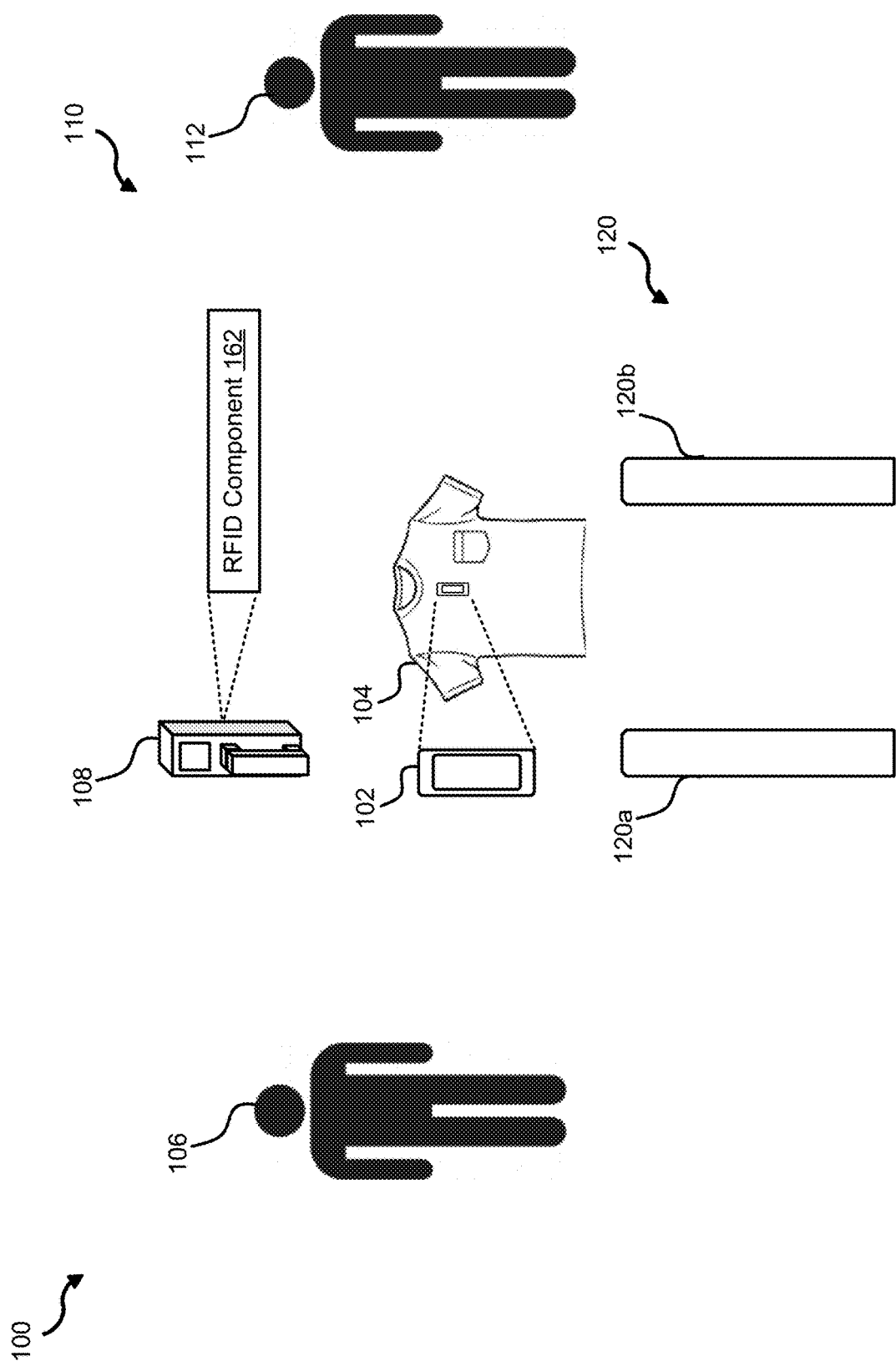
FIG. 1 illustrates an example of an environment for utilizing an AM tag in accordance with aspects of the present disclosure.

Turning now to FIG. 1, an example environment 100 for utilizing AM tags according to aspects of the present disclosure includes an AM tag 102 applied to a merchandise item 104 for electronic article surveillance. An example use case may include a customer 106 attempting to purchase the merchandise item 104 having the AM tag 102 in a store 110. After the purchase, an employee 112 of the store 110 may use a deactivation device 108 to deactivate the AM tag 102 from an activated state to a deactivated state. For example, in the activated state, a detector 120 in the store 110 may detect the AM tag 102 by using a transmitter 120a to transmit an acousto-magnetic signal of a specific frequency, which causes the resonator in the AM tag 102 to generate a response signal at a resonant frequency that is the same frequency as the acousto-magnetic signal. The detector 120 also includes a receiver 120b configured to detect the response signal, and in response, may trigger an alarm. Further, for example, in the deactivated state, the AM tag 102 may not generate a response signal, and hence avoids triggering the alarm. The deactivation device 108 may include a radio-frequency identification (RFID) component 162 that causes the deactivation device 108 to transfer energy to the AM tag 102 to change the AM tag 102 from the activated state to the deactivated state. The deactivation device 108 may include a RFID scanner/reader/transmitter, a wireless device, a mobile phone, a cellular phone, a tablet computer, a personal digital assistant, a smartphone, or other portable devices capable of wireless communications, such as RFID communication. The deactivation device 108 may be configured to communicate via RF communication, wired communication, near-field communication (NFC), and other communication mechanisms.

In certain implementations, once the AM tag 102 is attached to the merchandise item 104, it may be difficult to remove the AM tag 102 without, for example, damaging the merchandise item 104. The AM tag 102 may deter the would-be thief from stealing the merchandise item 104 because the difficulty associated with removing the AM tag 102 and/or potential damages to the merchandise item 104 when the AM tag 102 is removed without the removal code or other proper means. For example, the tag 102 may optionally include permanent ink that sprays when the AM tag 102 is attempted to be improperly removed.

Figure 2:
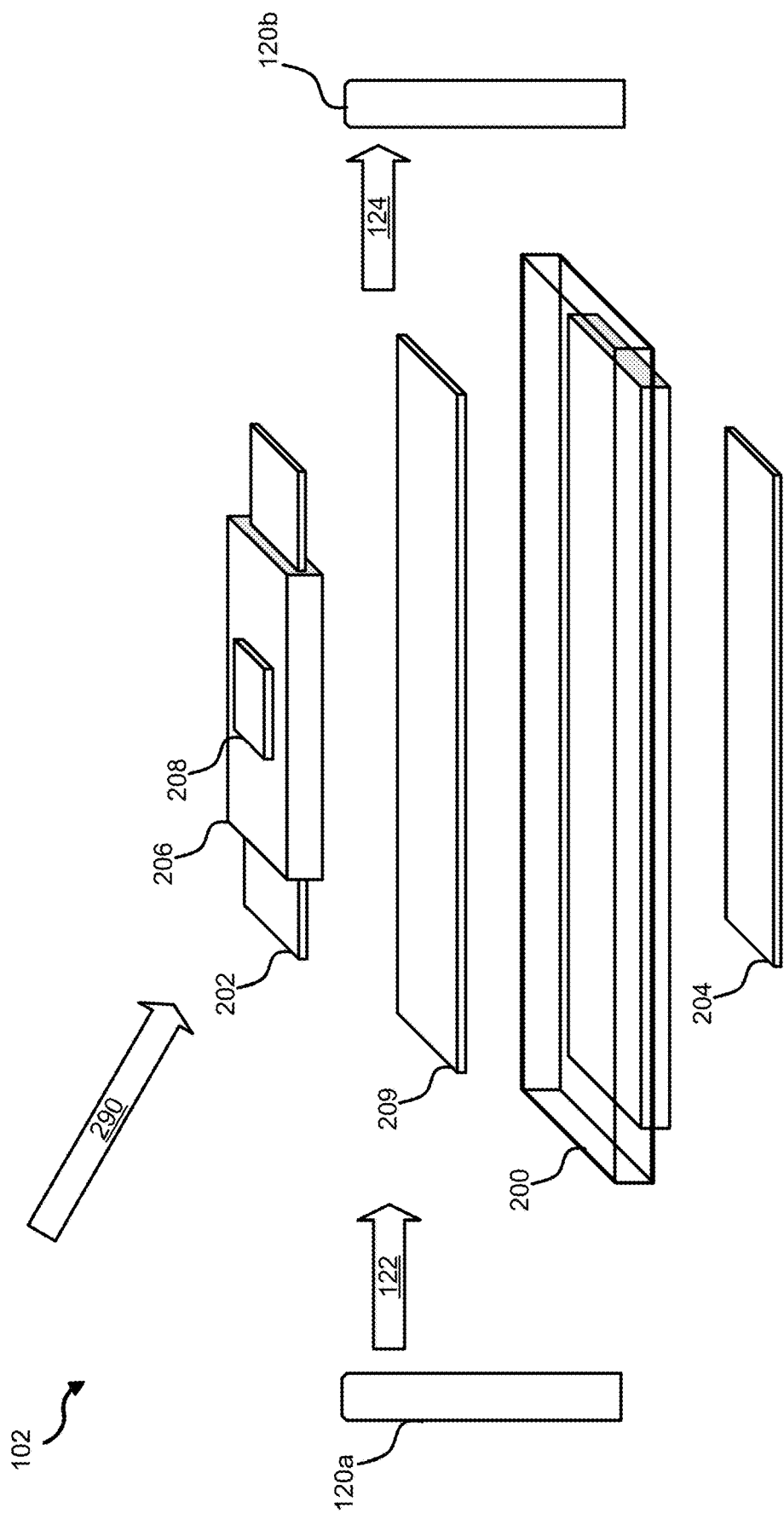
FIG. 2 illustrates an example of operation of the AM tag in accordance with aspects of the present disclosure.

Referring to FIG. 2, and continuing to reference FIG. 1, an example of the AM tag 102 according to certain aspects of the present disclosure may include a casing 200. In one example, the casing 200 may contain a resonator 209. The AM tag 102 may include a second bias strip 204, and a first bias strip 202 associated with the deactivating functionality. The first bias strip 202 and the second bias strip 204 may be disposed on the surfaces of the casing 200 on the outside of the casing 200. The second bias strip 204 may be a ferromagnetic metal strip, an amorphous metal strip, and/or other suitable materials. The first bias strip 202 may be a ferromagnetic metal strip, an amorphous metal strip, and/or other suitable materials. The AM tag 102 may include a biasing coil 206 that partially or completely encapsulates the first bias strip 202. A deactivation chip 208 may be placed on or near the biasing coil 206. In some implementations, the resonator 209 may have a resonant frequency that depends on the strength of magnetic flux applied to the resonator 209. Under the application of the magnetic flux from the second bias strip 204, the resonator 209 may have a first resonant frequency. Under the application of the combined magnetic flux from the first bias strip 202 (when magnetized by the deactivation signal 290) and the second bias strip 204, the resonator 209 may have a second resonant frequency different from the first resonant frequency.

During operation, in some implementations, the AM tag 102 may be in the activated state. In the activated state, the second bias strip 204 of the AM tag 102 may be magnetized and the first bias strip 202 of the AM tag 102 may be demagnetized. When the AM tag 102 is placed near (e.g., within up to 1 inch, 3 inches, 6 inches, 1 foot, 2 feet, or 3 feet), the transmitter 120a may transmit an interrogating AM signal 122. The interrogating AM signal 122 may have a frequency substantially identical to the first resonant frequency of the resonator 209. In some implementations, the transmitter 120a may intermittently or continuously transmit the interrogating AM signal 122. In response to receiving the interrogating AM signal 122, the resonator 209 may vibrate at a vibrational frequency substantially identical to the first resonant frequency.

In some instances, the vibration of the resonator 209 may generate an induced AM signal 124. The induced AM signal 124 may have a frequency substantially identical to one of the frequency of the interrogating AM signal 122, or the first resonant frequency of the resonator 209. The receiver 120b may be configured to detect the induced AM signal 124. Upon detection of the induced AM signal 124, the detector 120 may trigger an alarm to alert the employee 112 that the AM tag 102 is in the activated state and located in a vicinity of the detector 120.

In certain aspects of the present disclosure, signals that carry frequencies different from the frequency of the induced AM signal 124 may not be detected by the receiver 120b.

In some aspects, the resonator 209 may not vibrate in response to receiving signals having frequencies different from its resonant frequency.

Still referring to FIGS. 1 and 2, during operation, in some implementations, the AM tag 102 may be deactivated by a deactivation signal 290, such as but not limited to an RFID signal, a near-field communication (NFC) signal, an inductively transmitted signal, an RF signal, or other electromagnetic signals. Prior to receiving the deactivation signal, the second bias strip 204 of the AM tag 102 in the activated state may be magnetized and the first bias strip 202 of the AM tag 102 may be demagnetized. The resonator 209 may vibrate at the first resonant frequency. During the deactivation process, the deactivation device 108 may transmit the deactivation signal to the AM tag 102 in the activation state. The energy in the deactivation signal 290 may be utilized by the deactivation chip 208 to magnetize the first bias strip 202. For example, the deactivation chip 208 may receive the deactivation signal (via a receiving coil, described below). The energy in the deactivation signal 290 may be stored by the deactivation chip 208. In response to the stored energy exceeding a predetermined threshold, the deactivation chip 208 may direct the energy to the biasing coil 206 to magnetize the first bias strip 202 from a demagnetized state to a magnetized state. After the first bias strip 202 is magnetized, the first bias strip 202 and the second bias strip 204 may produce a combined magnetic flux larger than the magnetic flux produced by the second bias strip 204.

In certain implementations, after the first bias strip 202 is in the magnetized state, when the AM tag 102 is placed near (e.g., within up to 1 inch, 3 inches, 6 inches, 1 foot, 2 feet, or 3 feet), the transmitter 120a may transmit the interrogating AM signal 122. As noted, due to the magnetization of the first bias strip 202, the interrogating AM signal 122 may have a frequency different than a second resonant frequency of the resonator 209 under the magnetic flux of the second bias strip 204 and the first bias strip 202, hence deactivating the AM label 102. In some implementations, the transmitter 120a may intermittently or continuously transmit the interrogating AM signal 122. In response to receiving the interrogating AM signal 122, the resonator 209 may vibrate at the second frequency different than the first resonant frequency. In a non-limiting example, the resonator 209 may not vibrate in response to receiving the interrogating AM signal 122.

Thus, in some instances where the AM tag 102 is deactivated, the resonator 209 may not vibrate sufficiently to generate the induced AM signal 124. The induced AM signal 124 may not be generated due to the lack of vibration from the resonator 209. In response, the receiver 120b may not detect the induced AM signal 124 due to the absence of the induced AM signal 124 or the frequency of the induced AM signal 124 shifting to a frequency different from the frequency of the interrogating AM signal 124 or the second resonant frequency of the resonator 209. Thus, the configuration of the AM tag 102 as described herein provides an efficient mechanism for deactivating the AM tag 102.

Figure 3:
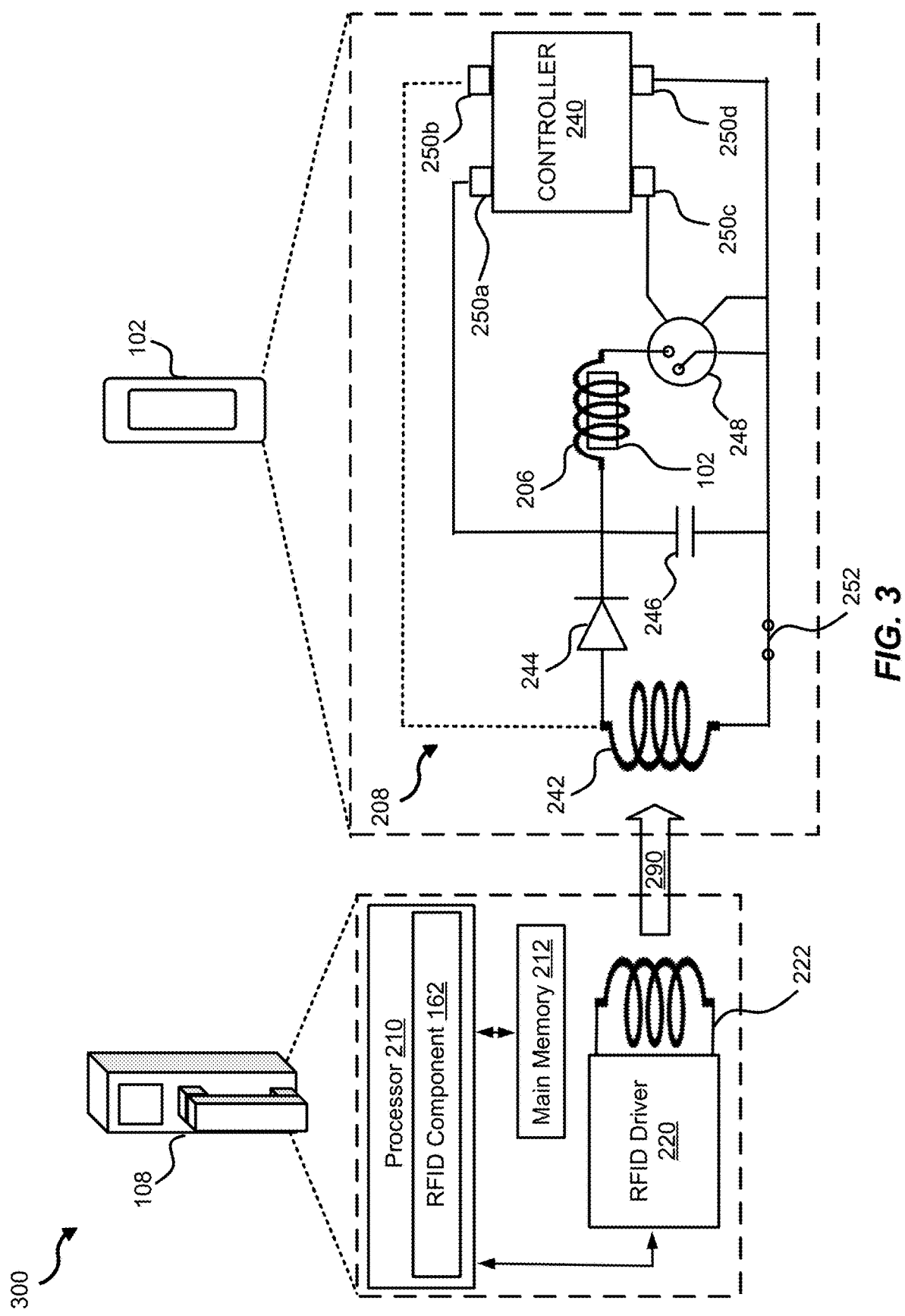
FIG. 3 illustrates an example of communication between a disabling device and the AM tag in accordance with aspects of the present disclosure.

Referring to FIGS. 2 and 3, an example of the deactivation device 108 for deactivating the AM tag 102 may include a processor 210 that execute instructions stored in a main memory 212 for performing the deactivating functions described herein. The term "processor," as used herein, can refer to a device that processes signals and performs general computing and arithmetic functions. Signals processed by the processor can include digital signals, data signals, computer instructions, processor instructions, messages, a bit, a bit stream, or other computing that can be received, transmitted and/or detected. A processor, for example, can include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described herein. The term "memory," as used herein, can include volatile memory and/or nonvolatile memory. Non-volatile memory can include, for example, ROM (read only memory), PROM (programmable read only memory), EPROM (erasable PROM) and EEPROM (electrically erasable PROM). Volatile memory can include, for example, RAM (random access memory), synchronous RAM (SRAM), dynamic RAM (DRAM), synchronous DRAM (SDRAM), double data rate SDRAM (DDR SDRAM), and direct RAM bus RAM (DRRAM).

The processor 210 may include the RFID component 162 that causes the RFID driver 220 to transmit the deactivation signal 290, via a transmitting coil 222, to the AM tag 102. The RFID driver 220 may energize the transmitting coil 222 to transmit the deactivation signal 290. The transmitting coil 222 may include one or more inductors that transmit or receive electromagnetic signals.

In certain examples, the deactivation device 108 may be a mobile phone configured to transmit RFID signals, RF signals, NFC signals, or other wireless signals. The deactivation device 108 may be a mobile phone associated with the customer 106. In a non-limiting example, the customer 106 may deactivate the AM tag 102 (after purchase, verification of purchase, and/or approval) using the mobile phone.

Additionally, in some non-limiting examples, the AM tag 102 may include a controller 240 that controls the deactivation of the AM tag 102. The AM tag 102 may include a receiving coil 242 configured to receive the deactivation signal 290 from the transmitting coil 222. The AM tag 102 may include a rectifying device 244 to control a direction of the electrical current generated when the receiving coil 242 receives the deactivation signal 290. In certain implementations, a wheat-stone bridge, a half bridge, or other rectifying devices may be used. In a non-limiting example, the rectifying device 244 may include a voltage-multiplying rectifier such as operational amplifiers, a voltage-doubler circuit, a voltage-tripler circuit, or other devices and/or circuits configured to increase a rectifying voltage.

In certain implementations, the AM tag 102 may include a capacitor 246 that stores the electrical energy from the deactivation signal 290. The AM tag 102 may include a switch 248 for discharging the stored electrical energy in the capacitor 246. The switch 248 may be a metal oxide semiconductor field effect transistor, a bipolar junction transistor, a junction field effect transistor, a metal semiconductor field effect transistor, a mechanical switch, a electromechanical switch, or other switches.

During operation, in some implementations, the processor 210 and/or the RFID component 162 may cause the RFID driver 220 to transmit the deactivation signal 290 via the transmission coil 222. The receiving coil 242 of the AM tag 102 may receive the deactivation signal 290. An electrical current generated from the reception of the deactivation signal 290 may flow through the rectifying device 244 and be stored in the capacitor 246. The electrical charges stored in the capacitor 246 may be provided to the controller 240 via a terminal 250a for electrical energy.

In optional implementations, a terminal 250b may receive the data carried in the deactivation signal 290 (if any).

In some non-limiting examples, the controller 240 may control the switch 248 via a terminal 250c. The switch 248 may be in an open position during a passive state of the AM tag 102 (i.e., no input signal) and/or the reception of the deactivation signal 290. When the switch 248 is in the open position, electrical charges stored in the capacitor 246 may not flow through the biasing coil 206.

According to aspects of the present disclosure, after the controller 240 "closes" the switch 248 (from the open position to a closed position), the switch 248 provides a path from the electrical charges stored in the capacitor 246 to flow, as an electrical current, from the capacitor 246 to the common terminal 250d through the biasing coil 206. The electrical current flowing through the biasing coil 206 may create a magnetic field around the biasing coil 206. The magnetic field may magnetize the first bias strip 202 from the demagnetized state to the magnetized state. The magnetized state of the first bias strip 202 may change the resonant frequency of the resonator 209, which deactivates the AM tag 102.

In optional implementations, the controller 240 may compare a voltage at the terminal 250a (i.e., voltage across the capacitor 246) to a predetermined threshold voltage value. When the voltage at the terminal 250a reaches the predetermined threshold voltage, the controller 240 may transmit a signal to close the switch 248 via the terminal 250c to trigger the demagnetization of the first bias strip 202.

In certain implementations, the deactivation signal 290 may be a direct current signal or an alternative current signal. The deactivation signal 290 may use less than 1 milli-Joules (mJ), 0.5 mJ, 0.3 mJ, 0.1 mJ, 0.05 mJ, or 0.01 mJ.

In one optional implementation, the deactivation chip 208 may include a fail-safe switch 252 that prevents accidental deactivation of the AM tag 102. When the fail-safe switch 252 is in a closed position (as shown), the AM tag 102 may be deactivated as described above. When the fail-safe switch 252 is in an open position, the AM tag 102 may not be deactivated. The fail-safe switch 252 may be a mechanical switch, an electrical switch, a micro-electromechanical switch, or other suitable switches. The fail-switch 252 may be connected to the controller 240 and the receiving coil 242, or any place that prevents the receiving coil 242 from charging the capacitor 246 (e.g., in series with the capacitor 246, in series with the rectifying device 244, etc.).

In one non-limiting example, the receiving coil 242 may be electrically connected to the rectifying device 244, the capacitor 246, the switch 248, and the terminal 250d of the controller 240. The rectifying device 244 may be electrically connected to the receiving coil 242, the biasing coil 206, the capacitor 246, and the terminal 250a of the controller 240. The capacitor 246 may be electrically connected to the rectifying device 244, the biasing coil 206, and the terminal 250a of the controller 240. The biasing coil 206 may be electrically connected to the rectifying device 244, the capacitor 246, the switch 248, and the terminal 250a of the controller 240. The switch 248 may be electrically connected to the biasing coil 206, the capacitor 246, the receiving coil 242, and the terminal 250c of the controller 240. The controller 240 may be connected to the biasing coil 206, the receiving coil 242, the rectifying device 244, the capacitor 246, and the switch 248.

Figure 4:
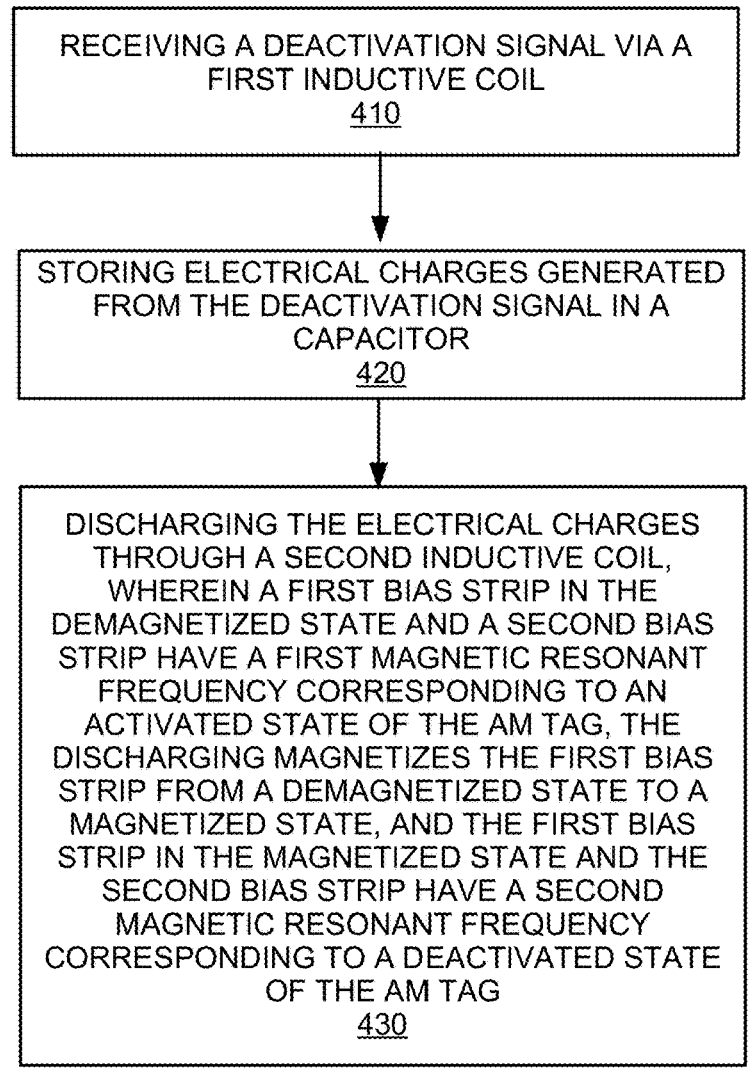
FIG. 4 illustrates an example of a method for disabling the AM tag in accordance with aspects of the present disclosure.

Referring to FIG. 4, an example method 400 for deactivating the AM tag 102 may be performed by the receiving coil 242, the capacitor 246, the biasing coil 206, the controller 240, and/or the deactivation chip 208 of the AM tag 102.

At block 410, the method 400 may receive a deactivation signal via a first inductive coil. For example, the receiving coil 242 and/or the deactivation chip 208 of the AM tag 102 may receive the deactivation signal 290. The deactivation signal 290 may be transmitted by the deactivation device 108, the RFID driver 220, and/or the transmitting coil 222.

At block 420, the method 400 may store electrical charges generated from the deactivation signal in a capacitor. For example, the capacitor 246 and/or the deactivation chip 208 of the AM tag 102 may store the electrical charges from the deactivation signal 290.

At block 430, the method 400 may discharge the electrical charges through a second inductive coil, wherein a first bias strip in the demagnetized state and a second bias strip cause a resonator to vibrate at a first resonant frequency corresponding to an activated state of the AM tag, the discharging magnetizes the first bias strip from a demagnetized state to a magnetized state, and the first bias strip in the magnetized state and the second bias strip cause the resonator to vibrate at a second resonant frequency different than the first resonant frequency, wherein the resonator vibrating at the second resonant frequency corresponds to a deactivated state of the AM tag. For example, the controller 240, the switch 248, and/or the deactivation chip 208 of the AM tag 102 may discharge the electrical charges through the biasing coil 206 to magnetize the first bias strip 202. The controller 240 may send a signal via the terminal 250c to close the switch 248. After the switch 248 is in the closed position, the electrical charges stored in the capacitor 246 may flow through the biasing coil 206 as an electrical current. The electrical current flowing through the biasing coil 206 may create a magnetic field around the biasing coil 206. The magnetic field may magnetize the first bias strip 202 from the demagnetized state to the magnetized state. The magnetized state of the first bias strip 202 may change the combined resonant frequency of the resonator 209, which deactivates the AM tag 102.

Figure 5:
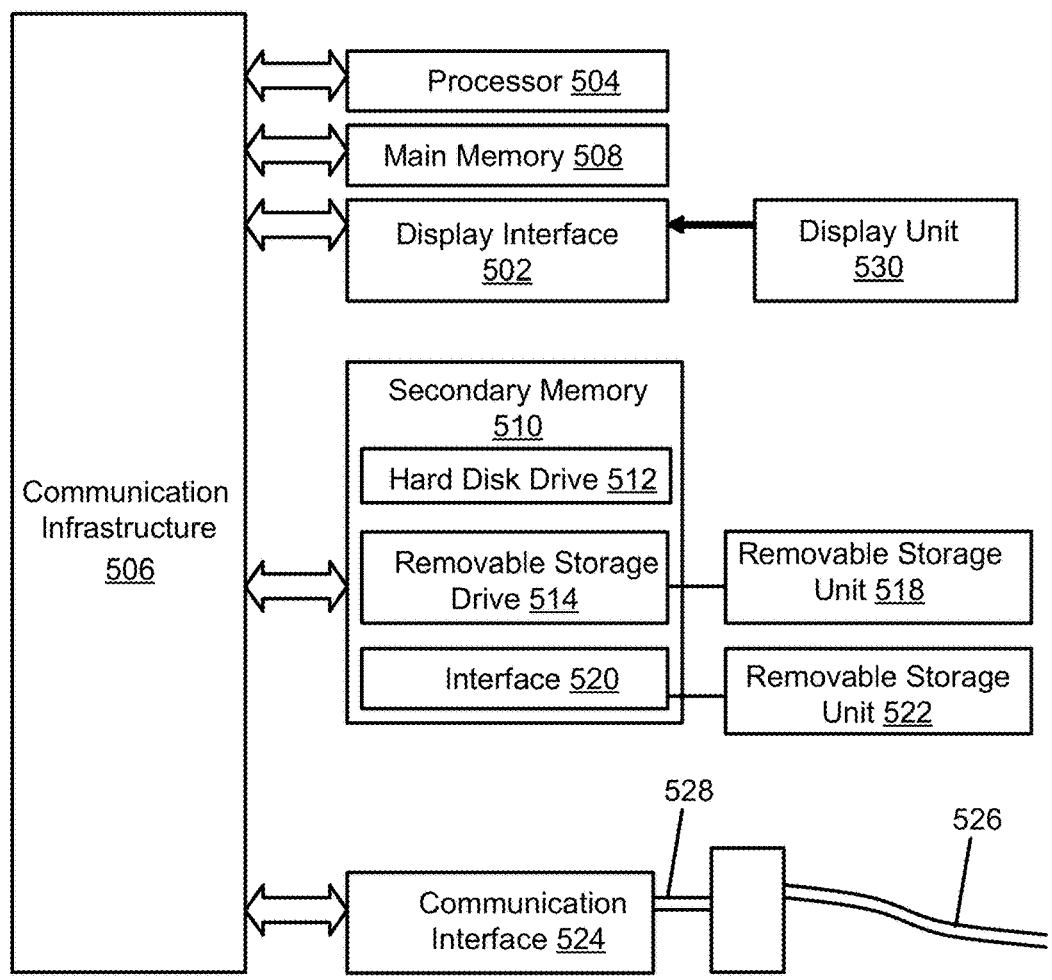
FIG. 5 illustrates an example of a computer system in accordance with aspects of the present disclosure.

Aspects of the present disclosures, such as the deactivation device 108 and/or the deactivation chip 208, may be implemented using hardware, software, or a combination thereof and may be implemented in one or more computer systems or other processing systems. In an aspect of the present disclosures, features are directed toward one or more computer systems capable of carrying out the functionality described herein. An example of such a computer system 500 is shown in FIG. 5. The deactivation device 108 and/or the deactivation chip 208 may include some or all of the components of the computer system 500.

The computer system 500 includes one or more processors, such as processor 504. The processor 504 is connected with a communication infrastructure 506 (e.g., a communications bus, cross-over bar, or network). The term "bus," as used herein, can refer to an interconnected architecture that is operably connected to transfer data between computer components within a singular or multiple systems. The bus can be a memory bus, a memory controller, a peripheral bus, an external bus, a crossbar switch, and/or a local bus, among others. Various software aspects are described in terms of this example computer system. After reading this description, it will become apparent to a person skilled in the relevant art(s) how to implement aspects of the disclosures using other computer systems and/or architectures.

The computer system 500 may include a display interface 502 that forwards graphics, text, and other data from the communication infrastructure 506 (or from a frame buffer not shown) for display on a display unit 530. Computer system 500 also includes a main memory 508, preferably random access memory (RAM), and may also include a secondary memory 510. The secondary memory 510 may include, for example, a hard disk drive 512, and/or a removable storage drive 514, representing a floppy disk drive, a magnetic tape drive, an optical disk drive, a universal serial bus (USB) flash drive, etc. The removable storage drive 514 reads from and/or writes to a removable storage unit 518 in a well-known manner. Removable storage unit 518 represents a floppy disk, magnetic tape, optical disk, USB flash drive etc., which is read by and written to removable storage drive 514. As will be appreciated, the removable storage unit 518 includes a computer usable storage medium having stored therein computer software and/or data. In some examples, one or more of the main memory 508, the secondary memory 510, the removable storage unit 518, and/or the removable storage unit 522 may be a non-transitory memory.

Alternative aspects of the present disclosures may include secondary memory 510 and may include other similar devices for allowing computer programs or other instructions to be loaded into computer system 500. Such devices may include, for example, a removable storage unit 522 and an interface 520. Examples of such may include a program cartridge and cartridge interface (such as that found in video game devices), a removable memory chip (such as an erasable programmable read only memory (EPROM), or programmable read only memory (PROM)) and associated socket, and other removable storage units 522 and interfaces 520, which allow software and data to be transferred from the removable storage unit 522 to computer system 500.

Computer system 500 may also include a communications interface 524. Communications interface 524 allows software and data to be transferred between computer system 500 and external devices. Examples of communications interface 524 may include a modem, a network interface (such as an Ethernet card), a communications port, a Personal Computer Memory Card International Association (PCMCIA) slot and card, etc. Software and data transferred via communications interface 524 are in the form of signals 528, which may be electronic, electromagnetic, optical or other signals capable of being received by communications interface 524. These signals 528 are provided to communications interface 524 via a communications path (e.g., channel) 526. This path 526 carries signals 528 and may be implemented using wire or cable, fiber optics, a telephone line, a cellular link, an RF link and/or other communications channels. In this document, the terms "computer program medium" and "computer usable medium" are used to refer generally to media such as a removable storage drive 518, a hard disk installed in hard disk drive 512, and signals 528. These computer program products provide software to the computer system 500. Aspects of the present disclosures are directed to such computer program products.

Computer programs (also referred to as computer control logic) are stored in main memory 508 and/or secondary memory 510. Computer programs may also be received via communications interface 524. Such computer programs, when executed, enable the computer system 500 to perform the features in accordance with aspects of the present disclosures, as discussed herein. In particular, the computer programs, when executed, enable the processor 504 to perform the features in accordance with aspects of the present disclosures. Accordingly, such computer programs represent controllers of the computer system 500.

In an aspect of the present disclosures where the method is implemented using software, the software may be stored in a computer program product and loaded into computer system 500 using removable storage drive 514, hard drive 512, or communications interface 520. The control logic (software), when executed by the processor 504, causes the processor 504 to perform the functions described herein. In another aspect of the present disclosures, the system is implemented primarily in hardware using, for example, hardware components, such as application specific integrated circuits (ASICs). Implementation of the hardware state machine so as to perform the functions described herein will be apparent to persons skilled in the relevant art(s).

It will be appreciated that various implementations of the above-disclosed and other features and functions, or alternatives or varieties thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of deactivating an acousto-magnetic (AM) tag, comprising:
   receiving a deactivation radio frequency (RF) signal via an antenna;
   storing electrical charges generated from the deactivation RF signal in a capacitor; and
   discharging the electrical charges through an inductive coil, wherein:
   a first bias strip in a demagnetized state and a second bias strip cause a resonator to vibrate at a first resonant frequency corresponding to an activated state of the AM tag;
   the discharging magnetizes the first bias strip from the demagnetized state to a magnetized state; and
   the first bias strip in the magnetized state and the second bias strip cause the resonator to vibrate at a second resonant frequency different than the first resonant frequency, wherein the resonator vibrating at the second resonant frequency corresponds to a deactivated state of the AM tag.

2. The method of claim 1, wherein the inductive coil at least partially encapsulates the first bias strip.

3. The method of claim 1, wherein the discharging further includes discharging the electrical charges through a switch.

4. The method of claim 1, wherein the deactivation RF signal is a direct current signal.

5. The method of claim 1, further comprising, prior to storing the electrical charges, increasing a voltage of the electrical charges generated from the deactivation RF signal.

6. The method of claim 1, further comprising measuring a voltage of the electrical charges stored in the capacitor.

7. The method of claim 6, wherein the discharging further comprises discharging the electrical charges when the voltage of the electrical charges exceeds a predetermined threshold.

8. An acousto-magnetic (AM) tag, comprising:
   a resonator;
   a first bias strip;
   a second bias strip;

a biasing coil at least partially encapsulating the first bias strip; and a circuit including:
- an antenna configured to receive a deactivation radio frequency (RF) signal;
- a capacitor configured to store electrical charges generated from the deactivation RF signal;
- a controller configured to cause the electrical charges to discharge from the capacitor through the biasing coil;

wherein:
- the first bias strip in a demagnetized state and the second bias strip cause the resonator to vibrate at a first resonant frequency corresponding to an activated state of the AM tag;
- the discharging magnetizes the first bias strip from the demagnetized state to a magnetized state; and
- the first bias strip in the magnetized state and the second bias strip cause the resonator to vibrate at a second resonant frequency different than the first resonant frequency, wherein the resonator vibrating at the second resonant frequency corresponds to a deactivated state of the AM tag.

9. The AM tag of claim 8, further comprising a switch having an open position and a closed position, wherein in response to the discharge from the capacitor through the biasing coil the controller is configured to cause the switch to change from the open position to the closed position to enable the discharge of the electrical charges through the switch.

10. The AM tag of claim 9, wherein the switch is one of a metal oxide semiconductor field effect transistor, a bipolar junction transistor, a junction field effect transistor, a metal semiconductor field effect transistor, a mechanical switch, or an electromechanical switch.

11. The AM tag of claim 8, further comprises a fail-safe switch that prevents accidental deactivation of the AM tag.

12. The AM tag of claim 8, further comprises a rectifying device configured to increase a voltage of the electrical charges stored in the capacitor.

13. The AM tag of claim 8, wherein the controller is further configured to measure a voltage of the electrical charges stored in the capacitor.

14. The AM tag of claim 13, wherein the controller is further configured to discharge the electrical charges in the capacitor in response to the voltage of the electrical charges exceeding a predetermined threshold.

15. The AM tag of claim 8, wherein an energy of the deactivation RF signal is less than 0.1 milli-Joule.

16. The AM tag of claim 8, wherein the electrical charges stored in the capacitor provide electrical energy to the controller.

17. A system, comprising:
an acousto-magnetic (AM) tag, comprising:
- a resonator;
- a first bias strip;
- a second bias strip;
- a biasing coil at least partially encapsulating the first bias strip; and
- a circuit including:
  - an antenna configured to receive a deactivation radio frequency (RF) signal;
  - a capacitor configured to store electrical charges generated from the deactivation RF signal;
  - a controller configured to cause the electrical charges to discharge from the capacitor through the biasing coil;
  - wherein:
    - the first bias strip in a demagnetized state and the second bias strip cause the resonator to vibrate at a first resonant frequency corresponding to an activated state of the AM tag;
    - the discharging magnetizes the first bias strip from the demagnetized state to a magnetized state; and
    - the first bias strip in the magnetized state and the second bias strip cause the resonator to vibrate at a second resonant frequency different than the first resonant frequency, wherein the resonator vibrating at the second resonant frequency corresponds to a deactivated state of the AM tag; and
a detector comprising:
- a transmitter configured to transmit an interrogating signal to the AM tag; and
- a receiver configured to:
  - detect an induced signal in response to the resonator vibrating at the first resonant frequency, and
  - fail to detect the induced signal in response to the resonator vibrating at the second resonant frequency.

18. The system of claim 17, wherein an energy of the deactivation RF signal is less than 0.1 milli-Joule.

19. The system of claim 17, wherein the electrical charges stored in the capacitor provide electrical energy to the controller.

20. The system of claim 17, wherein the detector is further configured to trigger an alarm in response to detecting the induced signal.

* * * * *